United States Patent [19]

Alspector et al.

[11] 4,441,249
[45] Apr. 10, 1984

[54] SEMICONDUCTOR INTEGRATED CIRCUIT CAPACITOR

[75] Inventors: Joshua Alspector, Westfield; Eliezer Kinsbron, Highland Park, both of N.J.; Marek A. Sternheim, Livermore, Calif.

[73] Assignee: Bell Telephone Laboratories, Incorporated, Murray Hill, N.J.

[21] Appl. No.: 382,403

[22] Filed: May 26, 1982

[51] Int. Cl.³ ............................................. H01L 21/70
[52] U.S. Cl. .................................. 29/577 C; 357/51; 357/59; 427/79; 427/80
[58] Field of Search ...................... 427/79, 80; 357/51, 357/59; 361/322; 29/25.42, 577 C

[56] References Cited

U.S. PATENT DOCUMENTS 4,391,032  7/1983  Schulte ................................... 29/571

Primary Examiner—Aaron Weisstuch
Attorney, Agent, or Firm—David I. Caplan; H. W. Lockhart

[57] ABSTRACT

Polyoxide capacitors for semiconductor integrated circuits having oxide dielectric films of 500 Angstroms or less are fabricated using in-situ doped polysilicon layers to have electrical field breakdowns of from 6 to 9 MV/cm. The first polysilicon layer is formed by LPCVD using silane and phosphine at a temperature in the range from about 570 degrees C. to 595 degrees C.

These capacitors are relatively precisely valued devices used particularly in applications such as filter/codecs. However, they are useful wherever integral capacitors are needed having high dielectric strength polyoxides, including such semiconductor integrated circuit devices as EPROMs and dynamic RAMs.

10 Claims, 1 Drawing Figure

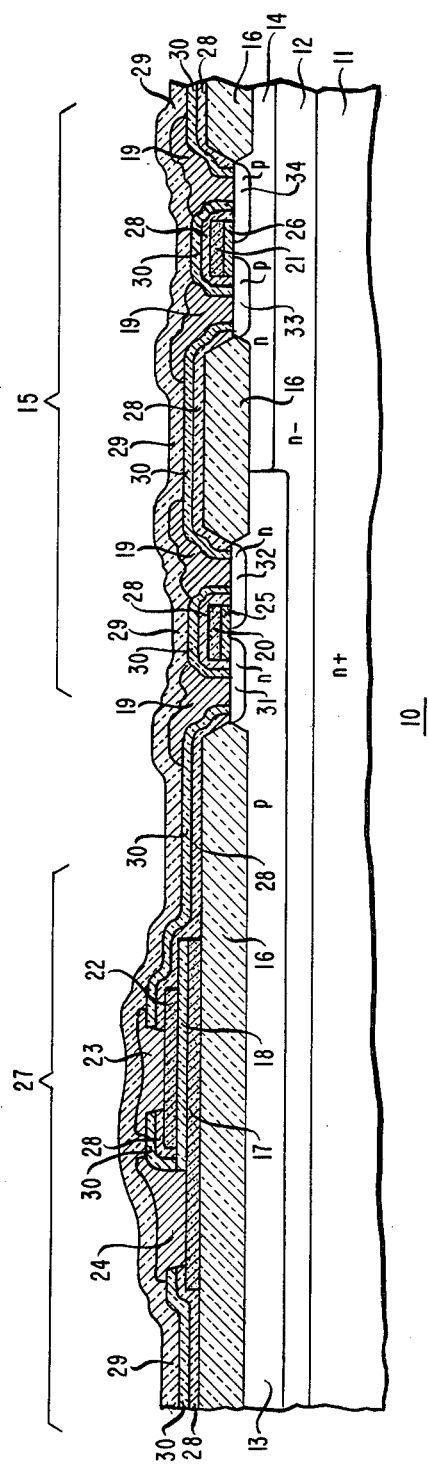

SEMICONDUCTOR INTEGRATED CIRCUIT CAPACITOR

TECHNICAL BACKGROUND

This invention relates to semiconductor integrated circuits and particularly to the type having relatively precisely valued capacitors formed integrally therewith. These capacitors are of the type composed of a sandwich of polycrystalline silicon, thermal oxide, and another layer of polycrystalline silicon. Polycrystalline silicon hereinafter will be referred to as polysilicon. Capacitors of this type, termed polyoxide capacitors, are important parts of certain semiconductor integrated circuits such as filter/codecs. These capacitors are chiefly used in devices fabricated using MOS technology and in the case of many applications, such as designs which include switched capacitor filters, occupy large portions of the semiconductor chip.

Semiconductor chip area is a valuable commodity, and there is a continual effort to achieve more compact design of both devices and interconnections. Capacitance is a direct function of area and an inverse function of the thickness of the dielectric. If the thickness of the dielectric oxide layer of polyoxide capacitors can be reduced, there can be a reduction in the area of the capacitor for a given capacitance.

However, the realization of higher capacitance devices from the use of thinner dielectric oxide layers is inhibited by the fact that dielectric integrity for films of about 600 Angstroms or less cannot be assured above an electric field strength of about 3.5 MV/cm. The structure of the oxide constituting the dielectric of the polyoxide capacitor appears to be a function of the surface morphology of the polysilicon layer upon which the thermal oxide is grown. The figure given for breakdown is for structures in which the polysilicon has been made conductive by the customary practice of diffusing an impurity such as phosphorus into the polysilicon layer at a relatively high temperature after the polysilicon layer has been deposited. The polysilicon layer usually is deposited above or near the transition temperature from amorphous to crystalline structure, and thus results in a columnar crystalline structure with a relatively rough surface. This appears to considerably affect the character of the polysilicon layer surface.

Accordingly, it is a purpose of this invention to provide a technology for the fabrication of polyoxide capacitors which will result in higher electrical breakdown fields. An ancillary object is the fabrication of polyoxide capacitors of smaller area for a given value of capacitance.

SUMMARY OF THE INVENTION

We have found that a thermal oxide film grown on a polysilicon layer which has been deposited at a temperature lower than 600 degrees C. and has been doped in-situ, that is, as the layer is deposited, has superior electrical breakdown characteristics compared to that formed on polycrystalline silicon which is doped subsequent to deposition by a diffusion heat treatment. In particular, we have found a significant improvement in the characteristics of the thermal oxide when the polysilicon layer is formed by a process of low pressure chemical vapor deposition within a temperature range of from about 570 degrees C. to about 595 degrees C.

Polyoxide capacitors made in accordance with this invention exhibit electrical breakdown fields of about 6 to 9 MV/cm for oxide films having a thickness of about 500 Angstroms or less. The improvement also is evidenced in capacitors having thicker dielectric oxide films which are capable of withstanding higher electric fields than hitherto practicable. The process in accordance with the invention is compatible with current technology, particularly of the MOS type. Reference is made herein to the copending application of L. C. Parrillo and R. S. Payne, Ser. No. 328,150, filed Dec. 7, 1981, which describes a process for fabricating semiconductor integrated circuit devices of the so-called CMOS twin-tub type. The process described therein involves certain procedures which are more or less standard for MOS technology and are useful in describing the practice of the subject invention. In particular, following the formation of the thin and thick oxide films on the surface of the silicon chip, a layer of polysilicon (poly I) is deposited which is subsequently patterned to form the gate structures and conductive interconnections for the device. As a part of this step, the first polysilicon layer constituting the lower plate of the polyoxide capacitor also is defined.

In accordance with the invention, this first polysilicon layer is deposited using a low pressure chemical vapor deposition process in a reactor at a temperature in the range of 570 degrees C. to 595 degrees C. by the pyrolysis of silane ($SiH_4$) and phosphine ($PH_3$) diluted in nitrogen. Under these deposition conditions, the polysilicon film exhibits a relatively smooth surface which therefore provides a smooth interface with the subsequently formed thermal oxide. The thermal oxide is grown preferably in an atmosphere of dry oxygen at a temperature in the range from about 900 to 1,100 degrees C. The character of the interface between the polysilicon and the oxide is determined almost immediately by the onset of oxide growth, thus preserving the relatively smooth interface between the polysilicon and the oxide. The capacitor is completed by the deposition of a second polysilicon layer (poly II) on top of the oxide, and contacts are provided to both the upper and lower polysilicon plates.

As previously noted, capacitors formed in this fashion have exhibited electrical breakdown fields from 6 to 9 MV/cm for an oxide thickness of about 500 Angstroms. The process is compatible with the integrated circuit technology inasmuch as the polysilicon conductive pattern on the semiconductor chip, which is doped similarly to the capacitor plate, exhibits desirable sheet resistances, and there appears to be no adverse effect on the threshold voltages of MOS devices produced in conjunction with this technique.

Thus, a feature of the invention is a method for producing improved polyoxide capacitors which is completely compatible with standard MOS technology. The process produces capacitors in which the required area is reduced by at least 30 percent over that required for capacitors produced by the previously known technique.

BRIEF DESCRIPTION OF THE DRAWING

The invention and its other objects and features will be more clearly understood from the following detailed description taken in conjunction with the drawing which is a sectional view of a surface portion of a CMOS type integrated circuit including a polyoxide capacitor in accordance with this invention.

DETAILED DESCRIPTION

A polyoxide capacitor in accordance with the invention is illustrated in the drawing as part of a CMOS structure. In particular, the CMOS arrangement is of the so-called twin-tub type, as described in the aforementioned application of Parrillo et al. Bracketed portion 15 of the silicon chip 10 comprises the n and p channel MOS transistors, and the bracketed portion 27 includes the polyoxide capacitor.

The twin-tub CMOS structure and the method of its fabrication are disclosed in detail in the copending application referred to above, which is incorporated herein by reference. In brief, the silicon chip portion 10 comprises an n+ substrate 11 on which a more lightly doped n epitaxial layer 12 is grown. The n region 14 and the p region 13 comprise the twin-tubs in which the complementary MOS transistors are formed.

Each of the transistors comprise source and drain regions 31, 32, 33, 34 and gate electrodes 20, 21 overlying thin gate oxides 25, 26. The surface of the silicon chip is covered by successive layers of silicon oxide 28, phosphorus-doped oxide 30, commonly referred to as p glass, a layer of aluminum metallization comprising the contacts 19, 23, ad 24, and finally an overlayer of silicon nitride 29. The use of these dielectric coatings and their advantages are well known in the art.

Turning to the capacitor portion 27 of the chip, the capacitor is formed by a first conductive polysilicon layer 17 (poly I), an intermediate dielectric layer 18 composed of thermal silicon oxide, and a second layer of conductive polysilicon 22 (poly II). This capacitor structure is formed as an integral part of the standard fabrication process which departs significantly in the manner in which the dopant is added to the polysilicon layers to render them conductive.

In particular, following the formation of a thin oxide layer, a portion of which ultimately is the gate oxide 20, 21, and the formation of the thick or field oxide layer 16, a layer of polysilicon having a thickness typically of about 6,500 Angstroms is deposited over the entire surface of the wafer. Heretofore the practice has been to deposit this layer and subsequently to subject the body to a diffusion heat treatment in the presence of a dopant material such as phosphorus tribromide ($PBr_3$) which renders the polysilicon more conductive than is usual as-deposited form. However, in accordance with the invention, the low pressure chemical vapor deposition (LPCVD) process is modified to enable the addition of a conductivity-enhancing element such as phosphorus during the deposition process itself. It is important to the process that the temperature within the reactor chamber be maintained within a farily critical temperature range.

In particular, the LPCVD process for in-situ phosphorus-doped deposition of polysilicon is accomplished in the range of from about 570 degrees C. to about 595 degrees C., which produces a smooth surface, enabling the formation of a thermal oxide thereon capable of sustaining higher electrical fields without breakdown with thinner dielectric layers than heretofore possible. The deposition process and further details with respect to its significant aspects will be considered hereinafter.

The fabrication process for the capacitor continues following the formation of the first polysilicon layer 17, with the thermal oxidation of the polysilicon layer to form the oxide layer 18. This is done by heating in the presence of oxygen and in this specific embodiment, preferably dry oxygen. The oxidation temperature typically is about 1,000 degrees C., and a typical thickness in one specific embodiment is about 500 Angstroms of oxide. However, for other applications, thicknesses may range up to as much as 1,500 Angstroms and the growth temperature may be in the range from about 900 to 1,100 degrees C. using an atmosphere of dry oxygen.

After the oxidation step, the second polysilicon layer 22 (poly II) is deposited on top of the thermal oxide layer 18. It is advantageous, but not crucial, to deposit the second polysilicon layer 22 using the same process as used for the first. The thickness of the second layer also is similar to that of the first. Although a typical thickness for the polysilicon layers in this embodiment is about 6,500 Angstroms, thicknesses from about 1,000 Angstroms to about 10,000 Angstroms may be used in other applications.

A photoresist mask then is formed on the poly II layer which defines the polyoxide capacitor as well as any other portions of this layer used for the integrated circuit. A separate masking and etching operation exposes a portion of the upper surface of the poly I layer 17 to enable contacting during the metallization step which follows.

The device is completed in the usual fashion by the application and patterning of the undoped glass layer 28 and the phosphorus glass layer 30. After patterning these glass layers, contacts to the gate, source, and drain regions of the transistor are formed by the deposition and patterning of aluminum. The aluminum layer forms the contacts 19 to the sources and drains of the MOS transistors, and contacts 23 and 24 to the upper and lower plates of the polyoxide capacitor. Finally, a layer 29 of silicon nitride is applied as a seal over the entire surface.

Deposition of polysilicon ordinarily results in columnar grain crystalline material in which the grains tend to grow continuously from the surface on which they are deposited to the final surface of the polysilicon layer. This occurs particularly when the polysilicon is deposited at temperatures in excess of about 600 degrees C. These grains increase in size during further high temperature processing. As a consequence, the surface morphology of such polysilicon layers has a roughness or undulatory character determined by the termination of each of the large crystal grains at the surface.

The deposition process in accordance with this invention, in which the dopant is added during deposition and which uses a particular temperature range, results generally in material which is less ordered, that is, more amorphous, and consequently the surface tends to be smoother than in the case of diffused polysilicon previously used.

The process may be carried out in a reactor vessel suitable for the LPCVD method at temperatures in the range previously noted, about 570 degrees C. to about 595 degrees C. This temperature range is below the amorphous-to-crystalline transition temperature. A typical suitable pressure for the LPCVD process is about 380 mTorr, but may be in the range from about 300 to 500 mTorr. In the case of the in-situ doped polysilicon, phosphorus dopant is supplied by phosphine ($PH_3$) diluted in nitrogen. A particularly suitable arrangement for the LPCVD process utilizes a gas mixture as follows: 80 cc silane ($SiH_4$); 16 cc of 0.5 percent phosphine ($PH_3$) in nitrogen (N). This provides a ratio of phosphine-to-silane of 0.001. In a specific example, using these parameters at a temperature of 591 degrees C., a deposition rate of 40 Angstroms per minute was observed. The phosphine-silane ratio may be up to about 0.0015. If the concentration of phosphine is increased significantly, the effect is to reduce the deposition rate, which makes the process undesirably long. Phosphine-silane ratios less than 0.001 tend to result in polysilicon in which the dopant concentration is below the solubility limit in silicon and in which the sheet resistance is higher than desirable. Useful deposition rates range from about 35 to 45 Angstroms per minute. This temperature of 591 degrees C. gives a reasonable deposition rate and results in an extremely smooth surface on the polysilicon layer. The reduced thickness of the dielectric layer contributes to increased capacitance per unit area, thereby achieving one objective of the invention, namely to reduce the area required for a given polyoxide capacitor. Alternatively, the invention provides an increased capacitance within a given area or, using dielectric oxide layers of greater thickness, makes higher voltage devices.

Although the in-situ doped polysilicon deposition occurs at a somewhat slower rate than in the case of undoped polysilicon, the additional time required is more than offset by the elimination not only of the time required for a separate phosphorus diffusion step, but of the deleterious consequences of the diffusion heat treatment to capacitor characteristics. Thermal oxide layers as thin as 350 Angstroms have been found to exhibit electrical breakdown fields of about 6 MV/cm.

Although phosphorus has been disclosed in this specific embodiment for doping the polysilicon, other significant impurities well known in the art may be used such as, for example, arsenic supplied in the form of arsine gas. The use of a different dopant will change certain parameters of the process, in particular, deposition rate. These parameters can be adjusted so that the as-deposited films will preserve their amorphous structure and smooth surface.

What is claimed is:

1. The method of making a polyoxide capacitor in a silicon semiconductor integrated circuit comprising forming an insulating layer on a surface of a silicon semiconductor body, depositing on a portion of the insulating layer a first polysilicon layer by a pyrolytic process at a temperature in the range from 570 degrees C. to about 595 degrees C., which includes the addition of a conductivity-enhancing element, heating the semiconductor body in the presence of oxygen to grow on the surface of the first polysilicon layer an intermediate layer of silicon oxide, depositing upon at least a portion of the intermediate layer of oxide a second layer of conductive polysilicon, and providing electrical contacts to the first and second polysilicon layers.

2. The method of making a polyoxide capacitor in a silicon semiconductor integrated circuit comprising forming an insulating layer on a surface of a silicon semiconductor body, depositing on a portion of the insulating layer a first polysilicon layer by the pyrolytic decomposition of silane and a compound containing a conductivity-enhancing element at a temperature in the range from 570 degrees C. to about 595 degrees C., heating the semiconductor body in the presence of oxygen to grow on the first polysilicon layer an intermediate layer of silicon oxide, depositing on at least a portion of the oxide layer a second layer of conductive polysilicon, and providing electrical contacts to the first and second polysilicon layers.

3. The method in accordance with claim 2 in which the compound containing the conductivity-enhancing element is phosphine.

4. The method in accordance with claim 3 in which the ratio of phosphine-to-silane by volume is in the range from 0.001 to 0.0015.

5. The method in accordance with claim 2 in which the intermediate layer of silicon oxide is grown at a temperature in the range from about 900 to 1,100 degrees C.

6. The method in accordance with claim 5 in which the intermediate layer of oxide is grown in the presence of dry oxygen to a thickness of up to about 1,500 Angstroms.

7. The method in accordance with claim 2 in which the first polysilicon layer is deposited at a temperature of about 591 degrees C.

8. The method in accordance with claim 2 in which the first polysilicon layer is deposited to a thickness of about 6,500 Angstroms.

9. The process in accordance with claim 2 in which the pyrolytic decomposition occurs at a pressure in the range of about 300 to 500 mTorr.

10. The process in accordance with claim 9 in which the pressure is about 380 mTorr.

* * * * *

UNITED STATES PATENT AND TRADEMARK OFFICE
CERTIFICATE OF CORRECTION

PATENT NO. : 4,441,249

DATED : April 10, 1984

INVENTOR(S) : Joshua Alspector, Eliezer Kinsbron and
Marek A. Sternheim

It is certified that error appears in the above-identified patent and that said Letters Patent is hereby corrected as shown below:

In the Specification, column 3, line 46, "is" should read --its--.

Signed and Sealed this

Ninth Day of October 1984

[SEAL]

Attest:

Attesting Officer

GERALD J. MOSSINGHOFF

Commissioner of Patents and Trademarks